United States Patent
Park et al.

(10) Patent No.: US 9,543,938 B2
(45) Date of Patent: Jan. 10, 2017

(54) COMPARATOR, ANALOG-TO-DIGITAL CONVERTING SYSTEM AND METHOD OF DRIVING THE SAME

(71) Applicant: SK hynix Inc., Gyeonggi-do (KR)

(72) Inventors: Hyun-Mook Park, Gyeonggi-do (KR); Gun-Hee Yun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/749,247

(22) Filed: Jun. 24, 2015

(65) Prior Publication Data

US 2016/0277010 A1 Sep. 22, 2016

(30) Foreign Application Priority Data

Mar. 19, 2015 (KR) .................. 10-2015-0038118

(51) Int. Cl.
*H03K 5/24* (2006.01)
*H03M 1/56* (2006.01)
*H03K 5/08* (2006.01)
*H03K 4/08* (2006.01)
*H04N 5/3745* (2011.01)

(52) U.S. Cl.
CPC .......... *H03K 5/24* (2013.01); *H03K 4/08* (2013.01); *H03K 5/086* (2013.01); *H03M 1/56* (2013.01); *H04N 5/37455* (2013.01)

(58) Field of Classification Search
CPC ... H03K 5/2481; H04N 5/357; H04N 5/37455
USPC .............................. 327/65, 67, 77, 205, 206
See application file for complete search history.

(56) References Cited

U.S. PATENT DOCUMENTS

| | | | | |
|---|---|---|---|---|
| 8,330,499 B2 * | 12/2012 | Hirose | ............... | H03K 5/2481 327/65 |
| 8,872,088 B2 * | 10/2014 | Zhang | ................... | H04N 5/365 250/208.1 |
| 9,143,119 B2 * | 9/2015 | Sohn | .................... | H03K 5/2481 |
| 2013/0032695 A1 * | 2/2013 | Ishibashi | ............. | H03M 1/004 250/208.1 |
| 2015/0187335 A1 * | 7/2015 | Sugiyama | .............. | G09G 3/32 345/208 |

FOREIGN PATENT DOCUMENTS

| | | |
|---|---|---|
| JP | 2000-115642 | 4/2000 |
| JP | 2006-197426 | 7/2006 |

\* cited by examiner

*Primary Examiner* — Howard Williams
(74) *Attorney, Agent, or Firm* — IP & T Group LLP

(57) ABSTRACT

A comparator may include: a first comparison unit suitable for generating a comparison voltage by performing a comparison operation between a pixel signal and a ramp signal; a time point detection unit suitable for detecting specific timing points of the comparison operation in response to the comparison voltage and a reference voltage, and generating a detection signal corresponding to the specific timing points; a period determination unit suitable for determining an additional supply period in response to the detection signal and a period determination control signal; and an additional current supply unit suitable for supplying an additional current to the first comparison unit during the additional supply period.

14 Claims, 4 Drawing Sheets

COMPARATOR, ANALOG-TO-DIGITAL CONVERTING SYSTEM AND METHOD OF DRIVING THE SAME

CROSS-REFERENCE TO RELATED APPLICATIONS

The present application claims priority of Korean Patent Application No. 10-2015-0038118, filed on Mar. 19, 2015, which is incorporated herein by reference in its entirety.

BACKGROUND

1. Field

Exemplary embodiments of the present invention relate to an image sensor and, more particularly, to a comparator and an analog-to-digital converting system including the same.

The embodiments of the present invention may be applied to various systems such as a single-slope analog-to-digital converter (ADC) and a multi-slope ADC. Thus, the present invention is not limited to the embodiments presented below.

2. Description of the Related Art

An image sensor converts a voltage corresponding to light intensity into a digital code using a comparator and a ramp signal generator. That is, a comparator and a counter, which are included in each column of the image sensor, compare an output voltage of a pixel array with a ramp signal generated from the ramp signal generator. This then generates a code corresponding to an image.

As the gain of the image sensor increases, the slope of the ramp signal generated from the ramp signal generator decreases. Thus, the slope of the output waveform of the comparator also decreases. In this case, the output waveforms of the comparators included in the columns of the image sensor may spread and noise may occur.

SUMMARY

Various embodiments are directed to a comparator capable of adjusting a slope of an output waveform regardless of a slope of a ramp signal, and an analog-to-digital converting system including the same.

In an embodiment, a comparator may include: a first comparison unit suitable for generating a comparison voltage by performing a comparison operation between a pixel signal and a ramp signal; a time point detection unit suitable for detecting specific timing points of the comparison operation in response to the comparison voltage and a reference voltage, and generating a detection signal corresponding to the specific timing points; a period determination unit suitable for determining an additional supply period in response to the detection signal and a period determination control signal; and an additional current supply unit suitable for supplying an additional current to the first comparison unit during the additional supply period.

The time point detection unit may include a second comparison unit suitable for generating the detection signal by comparing the comparison voltage with the reference voltage.

The period determination unit may include a logic gate suitable for performing a logical operation on the period determination control signal and the detection signal.

The period determination control signal may include a signal corresponding to a ramping period of the ramp signal.

The additional current supply unit may include: an additional current supply/cutoff controller suitable for controlling the additional current to be supplied to the first comparison unit during the additional supply period, and controlling the additional current not to be supplied to the first comparison unit during periods other than the additional supply period; and a second current path unit suitable for supplying the additional current to the first comparison unit under the control of the additional current supply/cutoff controller.

In an embodiment, an analog-to-digital converting system may include: a comparator suitable for performing a comparison operation using a current during an additional supply period, the current greater than that used in periods other than the additional supply period; and a counter suitable for counting a comparison result of the comparator.

The comparator may include: a first comparison unit suitable for generating a comparison voltage by performing the comparison operation between a pixel signal and a ramp signal; a time point detection unit suitable for detecting specific timing points of the comparison operation in response to the comparison voltage and a reference voltage, and generating a detection signal corresponding to the specific timing points; a period determination unit suitable for determining the additional supply period in response to the detection signal and a period determination control signal; and an additional current supply unit suitable for supplying an additional current to the first comparison unit during the additional supply period.

The time point detection unit may include a second comparison unit suitable for generating the detection signal by comparing the comparison voltage with the reference voltage.

The period determination unit may include a logic gate suitable for performing an AND operation on the period determination control signal and the detection signal.

The period determination control signal may include a signal corresponding to a ramping period of the ramp signal.

The additional current supply unit may include: an additional current supply/cutoff controller suitable for controlling the additional current to be supplied to the first comparison unit during the additional supply period, and controlling the additional current not to be supplied to the first comparison unit during periods other than the additional supply period; and a second current path unit suitable for supplying the additional current to the first comparison unit under the control of the additional current supply/cutoff controller.

In an embodiment, a method of driving an analog-to-digital converting system, may include: generating a comparison voltage based on a comparison result between a pixel signal and a ramp signal by selectively using a first current and a third current, which is greater than the first current, during a ramping period; and counting the comparison voltage.

The generating of the comparison voltage may include generating the comparison voltage based on the third current during an additional supply period of the ramping period, and generating the comparison voltage based on the first current during periods other than the additional supply period of the ramping period.

The additional supply period may include a counting period in which the comparison voltage is counted.

The third current may be obtained by adding a second current to the first current.

The generating of the comparison voltage may include: generating the comparison voltage by performing a comparison operation for comparing the pixel signal with the ramp signal based on the first current during the other periods; generating a detection signal corresponding to specific timing points of the comparison operation in response to the comparison voltage and a reference voltage; determining the additional supply period in response to the detection signal and a period determination control signal; generating the second current and additionally supplying the second current, during the additional supply period; and generating the comparison voltage by performing a comparison operation between the pixel signal and the ramp signal based on the third current during the additional supply period.

In the generating of the comparison voltage using the first current, the second current may not be generated.

The second current may be generated through a current mirroring method.

DETAILED DESCRIPTION

Figure 1:
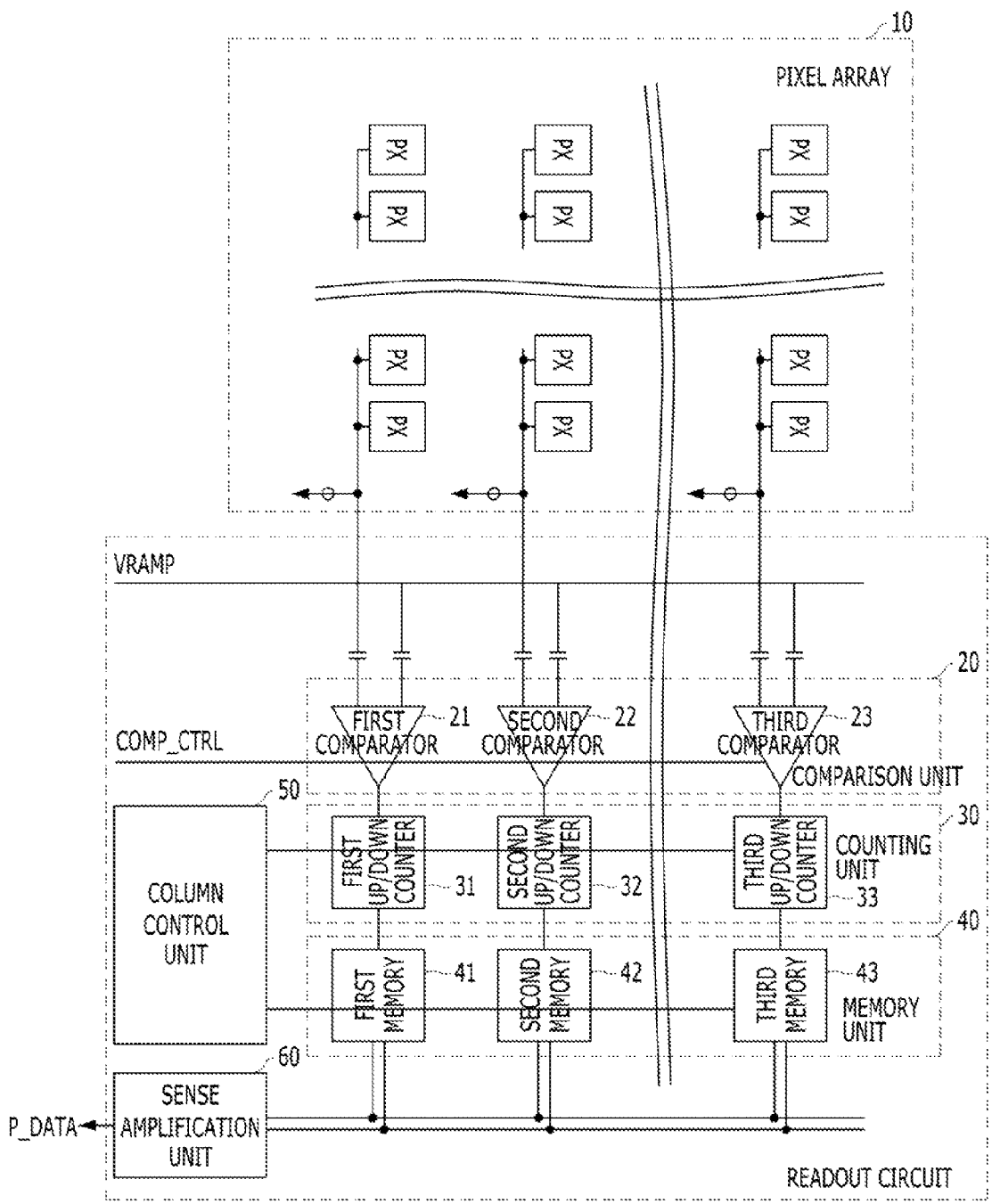
FIG. 1 is a block diagram illustrating a single-slope analog-to-digital converting system of a CMOS image sensor for promoting understanding of an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a single-slope analog-to-digital converting system of a complementary metal-oxide-semiconductor (CMOS) image sensor for promoting understanding of an embodiment of the present invention. FIG. 1 illustrates a single-slope analog-to-digital converting system having a general column parallel structure.

As illustrated in FIG. 1, the single-slope analog-to-digital converting system of the CMOS image sensor for promoting understanding of the embodiment of the present invention may include a pixel array 10, a comparison unit 20, a counting unit 30, a memory unit 40, a column control unit 50, and a sense amplification unit 60. The pixel array 10 may output a pixel signal corresponding to incident light. The comparison unit 20 compares the pixel signal outputted from the pixel array 10 with a ramp signal VRAMP applied from an external ramp signal generator (not illustrated) in response to a comparator control signal COMP_CTRL received from an external CMOS image sensor (CIS) controller (not illustrated). The counting unit 30 may count an output signal of the comparison unit 20. The memory unit 40 may store counting information provided from the counting unit 30. The column control unit 50 may control operations of the counting unit 30 and the memory unit 40. The sense amplification unit 60 may amplify a signal corresponding to data outputted from the memory unit 40 and output pixel data P_DATA.

The comparison unit 20 may include a plurality of comparators 21 to 23, the counting unit 30 may include a plurality of up/down counters 31 to 33, and the memory unit 40 may include a plurality of memories 41 to 43. In another embodiment, memories may be used instead of the up/down counters 31 to 31.

Hereafter, the first comparator 21, the first up/down counter 31, and the first memory 41 will be taken as an example for describing an analog-to-digital conversion operation.

In a general mode, the first comparator 21 may include a first terminal receiving a first pixel signal outputted from a first column pixel of the pixel array 10, and a second terminal receiving the ramp signal VRAMP applied from the external ramp signal generator, and compare the first pixel signal with the ramp signal VRAMP in response to the comparator control signal COMP_CTRL received from the external CIS controller.

At this time, since the ramp signal VRAMP has a voltage level which decreases with time, values of the first pixel signal and the ramp signal VRAMP inputted to the first comparator 21 may coincide with each other at a certain point. When the values of the first pixel signal and the ramp signal VRAMP coincide with each other, an output signal outputted from the first comparator 21 may be inverted.

Thus, the first up/down counter 31 may perform a counting operation from the point at which the ramp signal VRAMP drops to the point at which the output signal of the first comparator 21 is inverted, that is, during a counting period.

The first memory 41 may store a value counted through the first up/down counter 31, that is, counting information, and output the stored value.

As such, the column parallel analog-to-digital converting structure may include the analog-to-digital converting system provided at each column. The column parallel analog-to-digital converting structure may compare the value of the pixel signal outputted from each pixel with the value of the ramp signal applied from the ramp signal generator in response to the comparator control signal received from the CIS controller, perform the counting operation until the corresponding comparator makes a judgment, and output the counted value.

Figure 2:
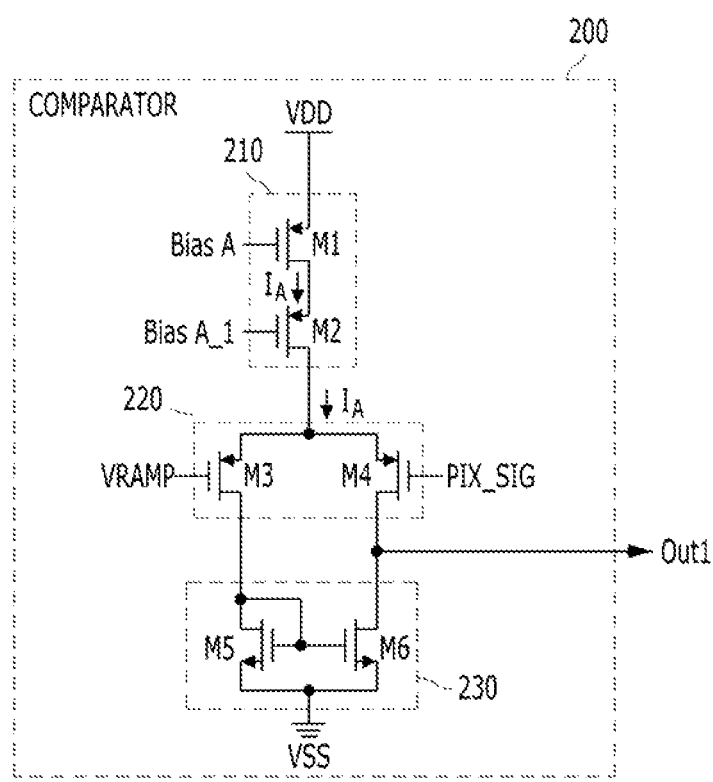
FIG. 2 is a circuit diagram illustrating a comparator of FIG. 1 for promoting understanding of an embodiment of the present invention.

FIG. 2 is a circuit diagram illustrating the comparator of FIG. 1 for promoting understanding of an embodiment of the present invention.

As illustrated in FIG. 2, the comparator 200 may include a first current path unit 210, a differential amplifier 220, and a common active load unit 230. The first current path unit 210 may supply a first current $I_A$ to the differential amplifier 220 in response to first and second bias voltages BiasA and BiasA_1 from outside. The differential amplifier 220 may differentially amplify a ramp signal VRAMP and a pixel signal PIX_SIG based on the first current $I_A$. The common active load unit 230 may serve as an output terminal. At this time, the first current path unit 210 may include first and second transistors M1 and M2, the differential amplifier 220 may include third and fourth transistors M3 and M4, and the common active load unit 230 may include fifth and sixth transistors M5 and M6.

Specifically, the first transistor M1 may have a gate electrode receiving the first bias voltage BiasA, a source electrode coupled to a first supply voltage (VDD) terminal, and a drain electrode coupled to a source electrode of the second transistor M2. The second transistor M2 may have a gate electrode receiving the second bias voltage BiasA_1, the source electrode coupled to the drain electrode of the first transistor M1, and a drain electrode coupled to source electrodes of the third and fourth transistors M3 and M4. The first and second transistors M1 and M2 may be implemented with PMOS transistors and serve as a current source.

The third transistor M3 may have a gate electrode receiving the ramp signal VRAMP, the source electrode coupled to the drain electrode of the second transistor M2, and a drain electrode coupled to a drain electrode of the fifth transistor M5. The fourth transistor M4 may have a gate electrode receiving the pixel signal PIX_SIG, the source electrode coupled to the drain electrode of the second transistor M2, and a drain electrode coupled to a drain electrode of the sixth transistor M6. At this time, the third and fourth transistors M3 and M4 may be implemented with PMOS transistors.

The fifth transistor M5 may have a gate electrode coupled to a gate electrode of the sixth transistor M6, a source electrode coupled to a second supply voltage (VSS) terminal, and the drain electrode coupled to the drain electrode of the third transistor M3. The sixth transistor M6 may have the gate electrode coupled to the gate electrode of the fifth transistor M5, a source electrode coupled to the second supply voltage (VSS) terminal, and the drain electrode coupled to the drain electrode of the fourth transistor M4. At this time, the fifth and sixth transistors M5 and M6 may be implemented with NMOS transistors. The gate electrode of the fifth transistor M5 and the gate electrode of the sixth transistor M6 may be coupled to the drain electrode of the fifth transistor M5, and the drain electrode of the sixth transistor M6 may be coupled to an output node Out1 and output a comparison voltage corresponding to a voltage obtained by amplifying a difference between the ramp signal VRAMP and the pixel signal PIX_SIG. A first supply voltage VDD may correspond to a power supply voltage, and a second supply voltage VSS may correspond to a ground voltage.

At this time, as the gain of the image sensor increases, the slope of the ramp signal generated from the ramp signal generator decreases. Thus, the slope of the comparison voltage outputted from the comparator also decreases. In this case, the comparison voltages outputted from the comparators included in the respective columns of the image sensor may be spread, and noise may occur.

Thus, during an additional supply period, the comparator in accordance with the embodiment of the present invention may perform a comparison operation using a current greater than used in other periods. For example, in an embodiment of the present invention, after the additional supply period of the comparator may be determined, an additional current may be supplied during the additional supply period. Thus, during the additional supply period, the slope of the comparison voltage may be increased to minimize noise and prevent the comparison voltage from being spread. During periods other than the additional supply period, current consumption may be minimized. This configuration will be described in detail with reference to FIGS. 3 and 4.

Figure 3:
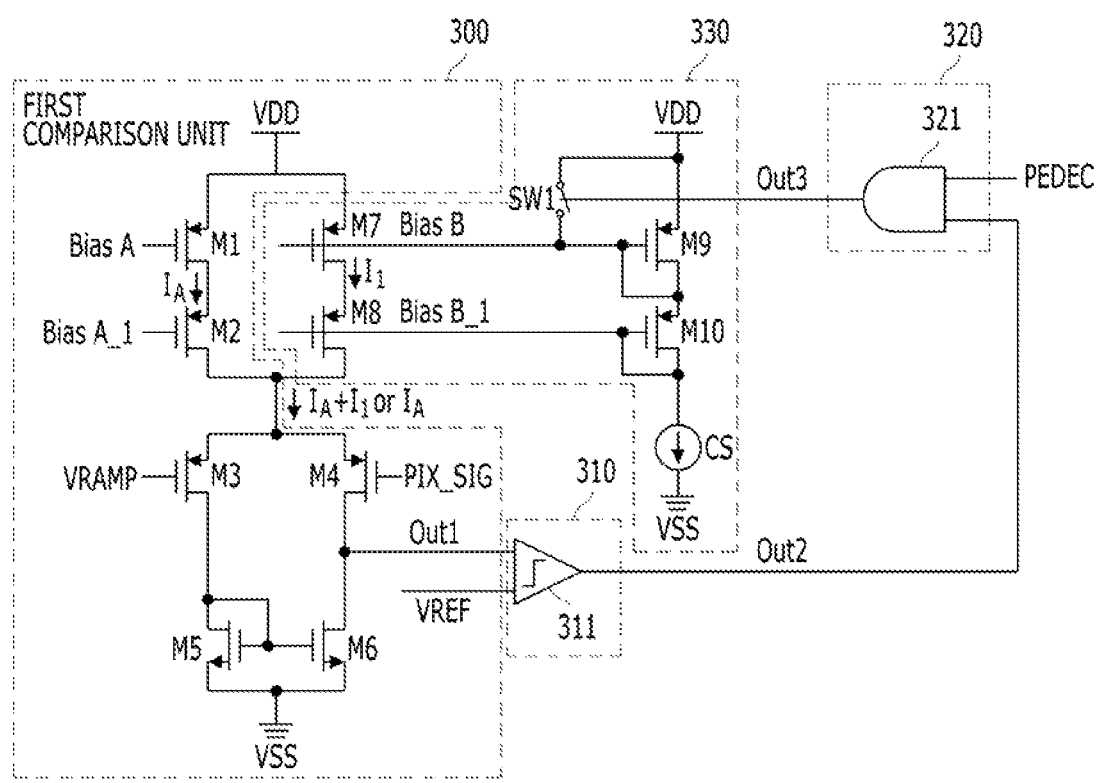
FIG. 3 is a circuit diagram illustrating a comparator in accordance with an embodiment of the present invention.

FIG. 3 is a circuit diagram illustrating a comparator in accordance with an embodiment of the present invention. The comparator may be applied to each comparator of FIG. 1, for example.

As illustrated in FIG. 3, the comparator in accordance with an embodiment of the present invention may include a first comparison unit 300, a time point detection unit 310, a period determination unit 320, and an additional current supply unit 330. The first comparison unit 300 may perform a comparison operation for comparing a pixel signal PIX_SIG with a ramp signal VRAMP, and output a comparison voltage Out1. The time point detection unit 310 may detect specific timing points of the comparison operation in response to the comparison voltage Out1 from the first comparison unit 300 and a reference voltage VREF from an external reference voltage generator (not illustrated), and output a detection signal Out2 corresponding to the specific timing points. The period determination unit 320 may determine an additional supply period in response to the detection signal Out2 and a period determination control signal PEDEC from an external controller (not illustrated), and output an additional supply period signal Out3. The additional current supply unit 330 may supply an additional current I1 to the first comparison unit 300 during the additional supply period in response to the additional supply period signal Out3.

Since the first comparison unit 300 may be configured and operated in the same manner as the comparator 200 illustrated in FIG. 2, detailed descriptions thereof are omitted.

The time point detection unit 310 may include a second comparison unit 311 which compares the comparison voltage Out1 outputted from the first comparison unit 300 with the reference voltage VREF applied from the external reference voltage generator, and detects the specific timing points of the comparison operation of the first comparison unit 300. At this time, the reference voltage VREF may be set in response to the comparison voltage Out1 outputted from the first comparison unit 300. For example, the reference voltage VREF may be set to approximately 0.3V.

The period determination unit 320 may include an AND gate 321 which performs an AND operation on the detection signal Out2 and the period determination control signal PEDEC received from the external controller, and determines the additional supply period. The period determination control signal PEDEC may include a control signal which has a high value during a ramping period and has a low value during periods other than the ramping period (refer to FIG. 4).

The additional current supply unit 330 may include an additional current supply/cutoff controller SW1, M9, M10, and CS and a second current path unit M7 and M8. The additional current supply/cutoff controller SW1, M9, M10, and CS may control the additional current I1 to be supplied to the first comparison unit 300 during the additional supply period determined through the period determination unit 320, and control the additional current I1 not to be supplied to the first comparison unit 300 during periods other than the additional supply period. The second current path unit M7 and M8 may supply a second current, i.e., the additional current I1, to the first comparison unit 300 under the control of the additional current supply/cutoff controller SW1, M9, M10, and CS. The second current path unit M7 and M8 may be implemented within the first comparison unit 300.

At this time, when the additional supply period signal Out3 outputted from the period determination unit 320 has a low value during periods other than the additional supply period, the switch SW1 may be turned on to apply third and fourth bias voltages BiasB and BiasB_1 corresponding to a first supply voltage VDD to the second current path M7 and M8. Thus, the second current I1 may not be supplied to the first comparison unit 300. In other words, when the switch SW1 is turned on, a gate-source voltage Vgs of a ninth transistor M9 may become 0V, and the ninth transistor M9 may be turned off. Thus, the second current I1 may not flow through the second current path unit M7 and M8, which forms a current mirroring structure with the ninth transistor M9.

On the other hand, when the additional supply period signal Out3 outputted from the period determination unit 320 has a high value during the additional supply period, the switch SW1 may be turned off in response to the additional supply period signal Out3. Then, as the third and fourth bias voltages BiasB and BiasB_1 are applied to the second current path unit M7 and M8, the second current I1 may be supplied to the first comparison unit 300. In other words, when the switch SW1 is turned off, the gate-source voltage Vgs of the ninth transistor M9 may become smaller than 0V, and the ninth transistor M9 may be turned on. Thus, the second current I1 may flow through the second current path unit M7 and M8, which forms the current mirroring structure with the ninth transistor M9.

Specifically, a seventh transistor M7 may have a gate electrode receiving the third bias voltage BiasB, a source electrode coupled to a first supply voltage (VDD) terminal, and a drain electrode coupled to a source electrode of an eighth transistor M8. The eighth transistor M8 may have a gate electrode receiving the fourth bias voltage BiasB_1, the source electrode coupled to the drain electrode of the seventh transistor M7, and a drain electrode coupled to source electrodes of third and fourth transistors M3 and M4. At this time, the seventh and eighth transistors M7 and M8 may be implemented with PMOS transistors. As such, the seventh and eighth transistors M7 and M8 may serve as a kind of additional current source.

The ninth transistor M9 may have a gate electrode coupled to a drain electrode thereof and receiving the third bias voltage BiasB, a source electrode coupled to the first supply voltage (VDD) terminal, and the drain electrode coupled to a source electrode of a tenth transistor M10. The tenth transistor M10 may have a gate electrode coupled to a drain electrode thereof and receiving the fourth bias voltage BiasB_1, the source electrode coupled to the drain electrode of the ninth transistor M9, and the drain electrode coupled to a second supply voltage (VSS) terminal through the current source CS. At this time, the ninth and tenth transistors M9 and M10 may be implemented with PMOS transistors. The switch SW1 may be coupled between the gate electrode and the source electrode of the ninth transistor M9.

The seventh transistor M7 and the ninth transistor M9 may commonly receive the third bias voltage BiasB through the gates thereof, and form a current mirroring structure. The eighth transistor M8 and the tenth transistor M10 may commonly receive the fourth bias voltage BiasB_1 through the gates thereof, and form a current mirroring structure.

Figure 4:
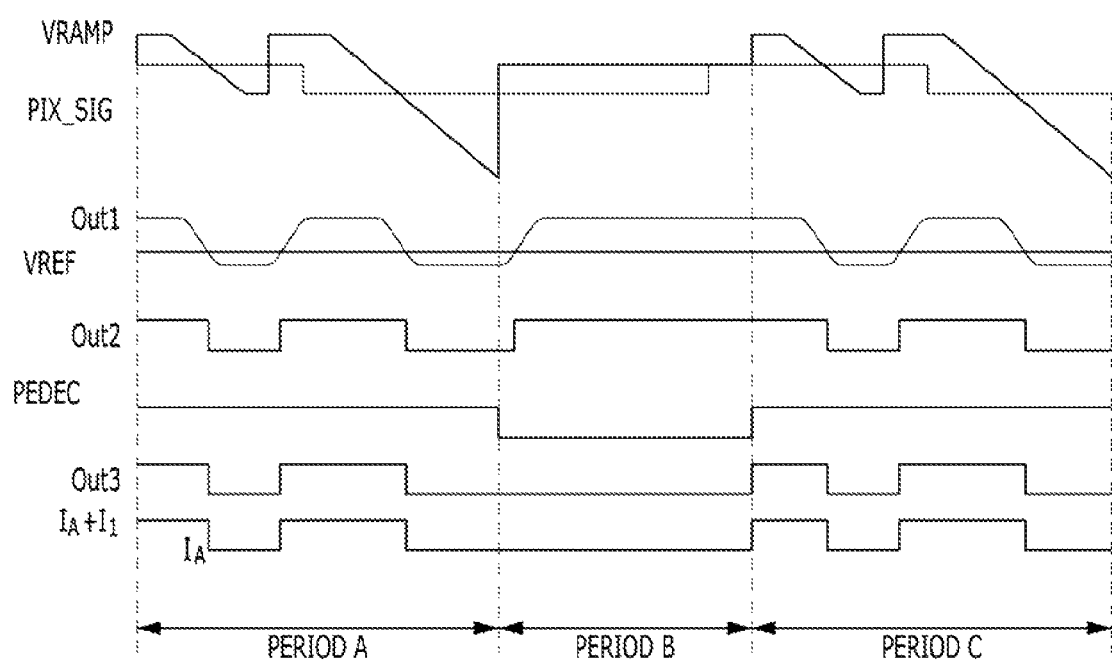
FIG. 4 is a timing diagram explaining an operation of the comparator of FIG. 3.

FIG. 4 is a timing diagram explaining an operation of the comparator of FIG. 3.

As illustrated in FIG. 4, the second comparison unit 311 may determine whether the comparison voltage Out1 outputted from the first comparison unit 300 is greater than the reference voltage VREF, and output the detection signal Out2 having a high level when the comparison voltage Out1 is greater than the reference voltage VREF, or output the detection signal Out2 having a low level when the comparison voltage Out1 is smaller than or equal to the reference voltage VREF.

Then, the AND gate 321 may perform the AND operation on the period determination control signal PEDEC and the detection signal Out2, and output the additional supply period signal Out3 for turning on or off the switch SW1 of the additional current supply unit 330.

At this time, when the additional supply period signal Out3 is low, the switch SW1 may be turned on, and the ninth and tenth transistors M9 and M10 may be turned off. Then, the second current I1 may not be supplied to the second current path unit M7 and M8. Thus, only the first current $I_A$ may flow as a source current through the first comparison unit 300. On the other hand, when the additional supply period signal Out3 is high, the switch SW1 may be turned off, and the ninth and tenth transistors M9 and M10 may be turned on. Then, the second current I1 may be supplied to the second current path unit M7 and M8. Thus, a third current $I_A+I1$ obtained by adding the second current I1 to the first current $I_A$ may flow through the first comparison unit 300.

Based on the operation of the above-described comparator, a method of driving the analog-to-digital converting system will be described as follows.

Referring to FIG. 4, the method of driving the analog-to-digital converting system may include generating a comparison voltage Out1 based on a comparison result between a pixel signal PIX_SIG and a ramp signal VRAMP by selectively using a first current $I_A$ and a third current $I_A+I1$ greater than the first current $I_A$ during a ramping period, i.e., periods A and C, of the ramp signal VRAMP; and counting the comparison voltage Out1.

The generating of the comparison voltage Out1 may include generating the comparison voltage Out1 based on the third current $I_A+I1$ during an additional supply period of the ramping period, in which the additional supply period signal Out3 is high, and generating the comparison voltage Out1 based on the first current $I_A$ during periods other than the additional supply period, in which the additional supply period signal Out3 is low.

For example, the generating of the comparison voltage Out1 may include comparing the pixel signal PIX_SIG with the ramp signal VRAMP based on the first current $I_A$ and generating the comparison voltage Out1 based on the comparison result, during the other period; generating the detection signal Out2 corresponding to specific timing points of the comparison operation in response to the comparison voltage Out1 and the reference voltage VREF; determining the additional supply period in response to the detection signal Out3 and the period determination control signal PEDEC; generating the second current I1 and additionally supplying the second current I1 during the additional supply period; and comparing the pixel signal PIX_SIG with the ramp signal VRAMP based on the third current $I_A+I1$ and generating the comparison voltage Out1 based on the comparison result, during the additional supply period.

The second current I1 may be generated and supplied through a current mirroring method.

The additional supply period in which the additional supply period signal Out3 is high may include a counting period in which the comparison voltage Out1 is counted during the counting operation of the comparison voltage Out1.

Therefore, in an embodiment of the present invention, the analog-to-digital converting system may supply the second current I1 only during the additional supply period of the ramping period, i.e., the periods A and C, in which the additional supply period signal Out3 is high, thereby increasing the response speed of the first comparison unit 300. Furthermore, the analog-to-digital converting system may not supply the second current I1 during periods other than the additional supply period, thereby minimizing additional current consumption in the first comparison unit 300.

The other periods may include a period B and a period A or C in which the additional supply period signal Out3 is low.

The above-described embodiment may be applied to a single-slope ADC or multi-slope ADC.

In accordance with an embodiment of the present invention, the analog-to-digital converting system may determine the additional supply period of the comparator and supply an additional current during the additional supply period. Thus, the analog-to-digital converting system may increase the slope of the output waveform of the comparator during the additional supply period, i.e., an image processing period, thereby minimizing noise and preventing the output waveform of the comparator from being spread. Furthermore, the analog-to-digital converting system may minimize current consumption during periods other than the additional supply period.

That is, the analog-to-digital converting system may individually adjust the current supplied to the comparator included in each column, thereby minimizing additional current consumption.

Although various embodiments have been described for Illustrative purposes, it will be apparent to those skilled in the art that various changes and modifications may be made without departing from the spirit and scope of the invention as defined in the following claims.

What is claimed is:

1. A comparator comprising:
   a first comparison unit suitable for generating a comparison voltage by performing a comparison operation between a pixel signal and a ramp signal;
   a time point detection unit suitable for detecting specific timing points of the comparison operation in response to the comparison voltage and a reference voltage, and generating a detection signal corresponding to the specific timing points;
   a period determination unit suitable for determining an additional supply period in response to the detection signal and a period determination control signal; and
   an additional current supply unit suitable for supplying an additional current to the first comparison unit during the additional supply period.

2. The comparator of claim 1, wherein the time point detection unit comprises a second comparison unit suitable for generating the detection signal by comparing the comparison voltage with the reference voltage.

3. The comparator of claim 1, wherein the period determination unit comprises a logic gate suitable for performing a logical operation on the period determination control signal and the detection signal.

4. The comparator of claim 1, wherein the period determination control signal comprises a signal corresponding to a ramping period of the ramp signal.

5. The comparator of claim 1, wherein the additional current supply unit comprises:
   an additional current supply/cutoff controller suitable for controlling the additional current to be supplied to the first comparison unit during the additional supply period, and controlling the additional current not to be supplied to the first comparison unit during periods other than the additional supply period; and
   a second current path unit suitable for supplying the additional current to the first comparison unit under the control of the additional current supply/cutoff controller.

6. An analog-to-digital converting system comprising:
   a comparator suitable for performing a comparison operation using a current during an additional supply period, the current greater than that used in periods other than the additional supply period; and
   a counter suitable for counting a comparison result of the comparator,
   wherein the comparator generates a comparison voltage by comparing a pixel signal with a ramp signal, and generates a detection signal by comparing the comparison voltage with a reference voltage, and
   wherein the additional supply period is determined in response to the detection signal,
   wherein the comparator, comprises:
      a first comparison unit suitable for generating a comparison voltage by performing the comparison operation between a pixel signal and a ramp signal;
      a time point detection unit suitable for detecting specific timing points of the comparison operation in response to the comparison voltage and a reference voltage, and generating a detection signal corresponding to the specific timing points;
      a period determination unit suitable for determining the additional supply period in response to the detection signal and a period determination control signal; and
      an additional current supply unit suitable for supplying an additional current to the first comparison unit during the additional supply period.

7. The analog-to-digital converting system of claim 6, wherein the period determination unit comprises a logic gate suitable for performing an AND operation on the period determination control signal and the detection signal.

8. The analog-to-digital converting system of claim 6, wherein the period determination control signal comprises a signal corresponding to a ramping period of the ramp signal.

9. The analog-to-digital converting system of claim 6, wherein the additional current supply unit comprises:
   an additional current supply/cutoff controller suitable for controlling the additional current to be supplied to the first comparison unit during the additional supply period, and controlling the additional current not to be supplied to the first comparison unit during periods other than the additional supply period; and
   a second current path unit suitable for supplying the additional current to the first comparison unit under the control of the additional current supply/cutoff controller.

10. A method of driving an analog-to-digital converting system, the method comprising:
   generating a comparison voltage based on a comparison result between a pixel signal and a ramp signal by selectively using a first current and a third current, which is greater than the first current, during a ramping period; and
   counting the comparison voltage,
   wherein the third current is obtained by adding a second current to the first current, and
   wherein the generating of the comparison voltage comprises:
      generating the comparison voltage by performing a comparison operation for comparing the pixel signal with the ramp signal based on the first current during the other periods;
      generating a detection signal corresponding to specific timing points of the comparison operation in response to the comparison voltage and a reference voltage;
      determining the additional supply period in response to the detection signal and a period determination control signal;

generating the second current and additionally supplying the second current, during the additional supply period; and generating the comparison voltage by performing a comparison operation between the pixel signal and the ramp signal based on the third current during the additional supply period.

11. The method of claim 10, wherein the generating of the comparison voltage comprises:

generating the comparison voltage based on the third current during an additional supply period of the ramping period; and generating the comparison voltage based on the first current during periods other than the additional supply period of the ramping period.

12. The method of claim 11, wherein the additional supply period comprises a counting period in which the comparison voltage is counted during the counting of the comparison voltage.

13. The method of claim 10, wherein, in the generating of the comparison voltage using the first current, the second current is not generated.

14. The method of claim 10, wherein the second current is generated through a current mirroring method.

\* \* \* \* \*